United States Patent
Anvari

(10) Patent No.: US 7,382,835 B2
(45) Date of Patent: Jun. 3, 2008

(54) POWER BOOSTER USING PEAK SUPPRESSION AND PRE-DISTORTION FOR TERMINAL RADIOS

(75) Inventor: Kiomars Anvari, 1567 Serafix Rd., Alamo, CA (US) 94507

(73) Assignee: Kiomars Anvari, Alamo, CA (US)

( * ) Notice: Subject to any disclaimer, the term of this patent is extended or adjusted under 35 U.S.C. 154(b) by 708 days.

(21) Appl. No.: 10/747,519

(22) Filed: Dec. 30, 2003

(65) Prior Publication Data
US 2005/0141639 A1 Jun. 30, 2005

(51) Int. Cl.
*H04K 1/02* (2006.01)
(52) U.S. Cl. .................. 375/297; 375/296
(58) Field of Classification Search ........... 375/296, 375/297
See application file for complete search history.

(56) References Cited

U.S. PATENT DOCUMENTS

| 6,141,390 A * | 10/2000 | Cova ............... 375/297 |
| 7,109,792 B2 * | 9/2006 | Leffel ............. 330/149 |
| 2004/0017859 A1 * | 1/2004 | Sills et al. ....... 375/296 |

* cited by examiner

*Primary Examiner*—Mohammed Ghayour
*Assistant Examiner*—Juan Alberto Torres

(57) ABSTRACT

A technique to boost the output power of portable radio terminals without increasing the power dissipation is described. The input to the terminal transmit amplifier is modified by a peak-to-average reduction and an amplitude pre-distortion circuit, prior to being applied to the amplifier. The peak-to-average reduction and pre-distortion circuit modifies the baseband samples before applying any amplitude pre-distortion. The amplitude pre-distortion uses a lookup table updated at power up or power down of the terminal radio, during idle time, just before origination of a call, before termination of a call, or while the call is active. During the updating of the lookup table the radio could be in its normal transmit mode, or transmit into a dummy load.

11 Claims, 2 Drawing Sheets

POWER BOOSTER USING PEAK SUPPRESSION AND PRE-DISTORTION FOR TERMINAL RADIOS

BACKGROUND OF INVENTION

Present invention relates to a peak-to-average reduction and pre-distortion circuit to boost the output power of a radio terminal power amplifier. The peak-to-average reduction and pre-distortion circuit is performed on the transmit baseband signal. The amplitude pre-distortion uses a look up table that is being updated on regular bases. In any wireless communication system one of the critical components is the power amplifier. This component has a major contribution in cost, power consumption, and size of the system. The main reason is the requirement of wireless radio communication system for linear power amplifiers. The higher the linearity, the higher the power consumption, cost and size. In order to minimize the cost, size and power consumption there is a need for techniques that overcome this problem. This invention conquers these challenges by using a simple and accurate peak-to-average reduction and pre-distortion circuit before the signal being applied to the power amplifier.

SUMMARY OF INVENTION

According to the invention, a peak-to-average reduction and pre-distortion circuit, for use with radio terminal transmit power amplifier, uses a plurality of simple and accurate functions in conjunction with intelligent signal processing to improve power handling of the transmit power amplifier. By intelligent, it is meant that the peak-to-average reduction and pre-distortion function has features of adaptability to the input feedback information from the output of the amplifier. The peak-to-average reduction and pre-distortion module uses the transmit baseband signal as its input and condition the input before applying it to the transmit power amplifier. The conditioning or peak-to-average reduction and pre-distortion helps to boost the power handling of the transmit amplifier or acts more linearly. The conditioning is based on pre-defined parameters stored in a lookup table for peak-to-average reduction and pre-distortion. The inputs to the peak-to-average reduction and pre-distortion should be within a limit that can be handled by the peak-to-average reduction and pre-distortion module.

In a particular embodiment, the peak-to-average and pre-distortion unit comprises a lookup table, an analog sampler which samples the output of the amplifier, an envelop detector, an analog switch at the output of the amplifier, a dummy load to absorb the output power during the adaptation period, and a signal processing block. The output of the envelop detector is converted to digital baseband to be used for the adaptation of the lookup table. The signal processing block performs the signal conditioning as well as performs the initial calibration, and transmitter control.

The invention will be better understood by reference to the following detailed description in conjunction with the accompanying drawings.

DESCRIPTION OF THE SPECIFIC EMBODIMENTS

In a first preferred embodiment the peak-to-average reduction function measures the peak-to-average of the signal as one criterion and uses the average output requirement of the signal as a second criterion to determine the amount of the peak-to-average reduction. In a second preferred embodiment of the invention, the pre-distortion function uses average output requirement of the signal and a lookup table to determine the pre-distortion of the signal. In a third preferred embodiment a sample of the output of the amplifier is used in an envelop detector to produce the envelop of the output signal. In a fourth embodiment the envelop of the amplifier output is digitized to be used by the pre-distortion algorithm function. In a fifth embodiment the digitized envelop of the power amplifier and the peak-to-average reduced baseband signals are used by the pre-distortion algorithm to adaptively update the pre-distortion lookup table. In a sixth embodiment an analog switch at the output of the amplifier is used to send the output of the amplifier to a dummy load during the updating of the pre-distortion lookup table.

Figure 1:
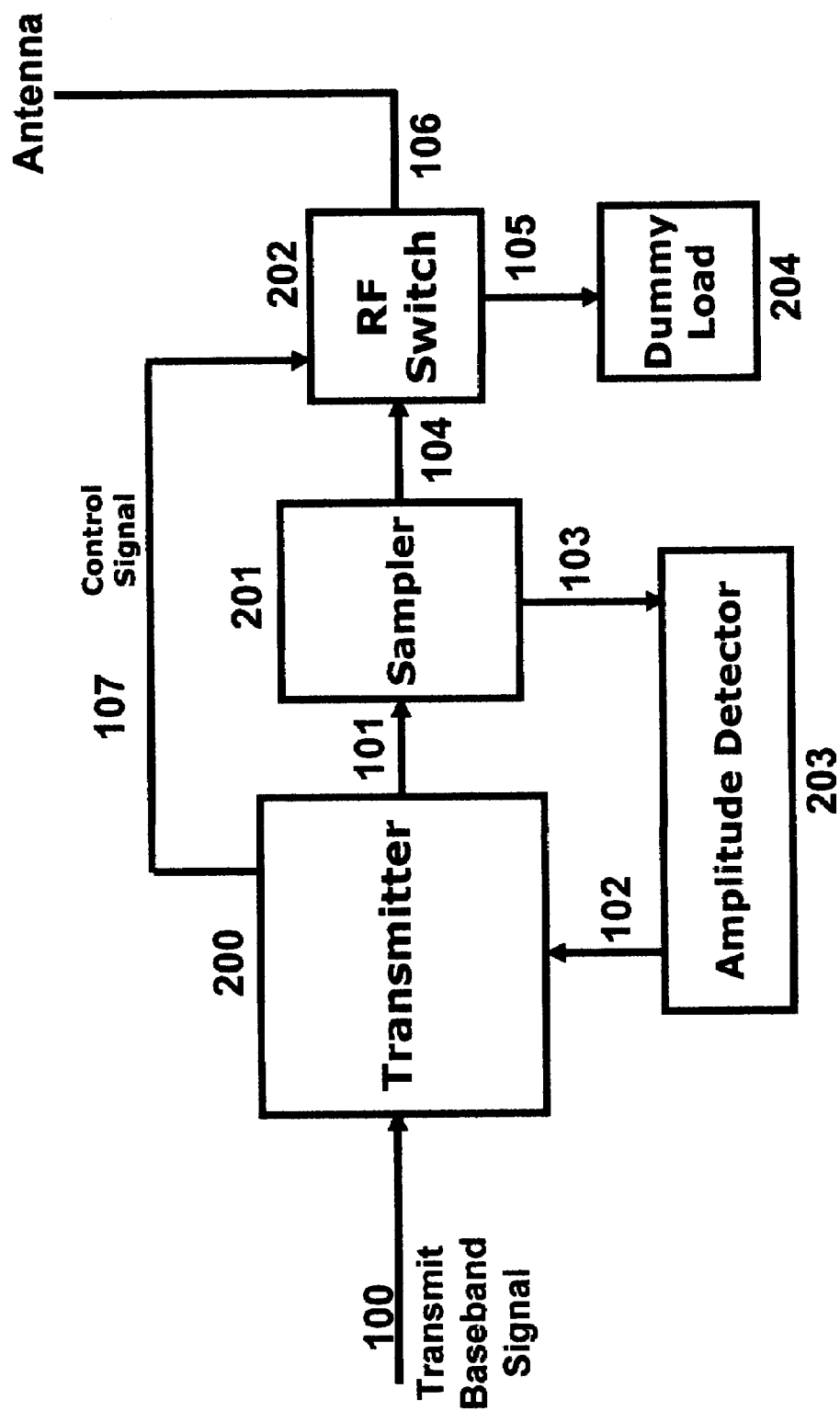
FIG. 1 is an overall block diagram of the a radio terminal transmitter using peak-to-average reduction and pre-distortion

Referring to FIG. 1, a peak-to-average reduction and pre-distortion circuit diagram is illustrated. The transmitter receives the transmit baseband input 100. The output of the transmitter that peak-to-average reduction and pre-distortion functions, and the power amplifier are part of is 101. The output of the transmitter 101 is applied to sampler block 201 to take a small sample of the transmitter output 103 to send to amplitude (envelop) detector 203. The amplitude (envelop) detector output 102 is sent back to the transmitter block 200 to be used for the adaptation of the pre-distortion lookup table. The output of the sampler 104 is applied to an analog switch 202 which is controlled from the transmitter block 200 by control signal 107. The output of the analog switch block 105 is applied to the dummy load 204. The other output of the analog switch 106 is applied to the antenna. The peak-to-average reduction and pre-distortion circuit performs the following functions:

1. Find the peak-to-average ratio of transmit baseband input.
2. Reduce the peak-to-average of the input signal 100 before applying to pre-distortion function
3. Amplitude pre-distort the peak-to-average reduced baseband signal
4. Use the feedback envelop signal from the output of the transmitter and the peak-to average reduced baseband signals to adaptively update the amplitude pre-distortion lookup table.
5. Perform the lookup table adaptation at power up, power down, idle time, or active mode. During power up, power down and idle time the lookup table adaptation is performed by sending the output of the transmitter which include the amplifier to a dummy load through an analog switch.

Figure 2:
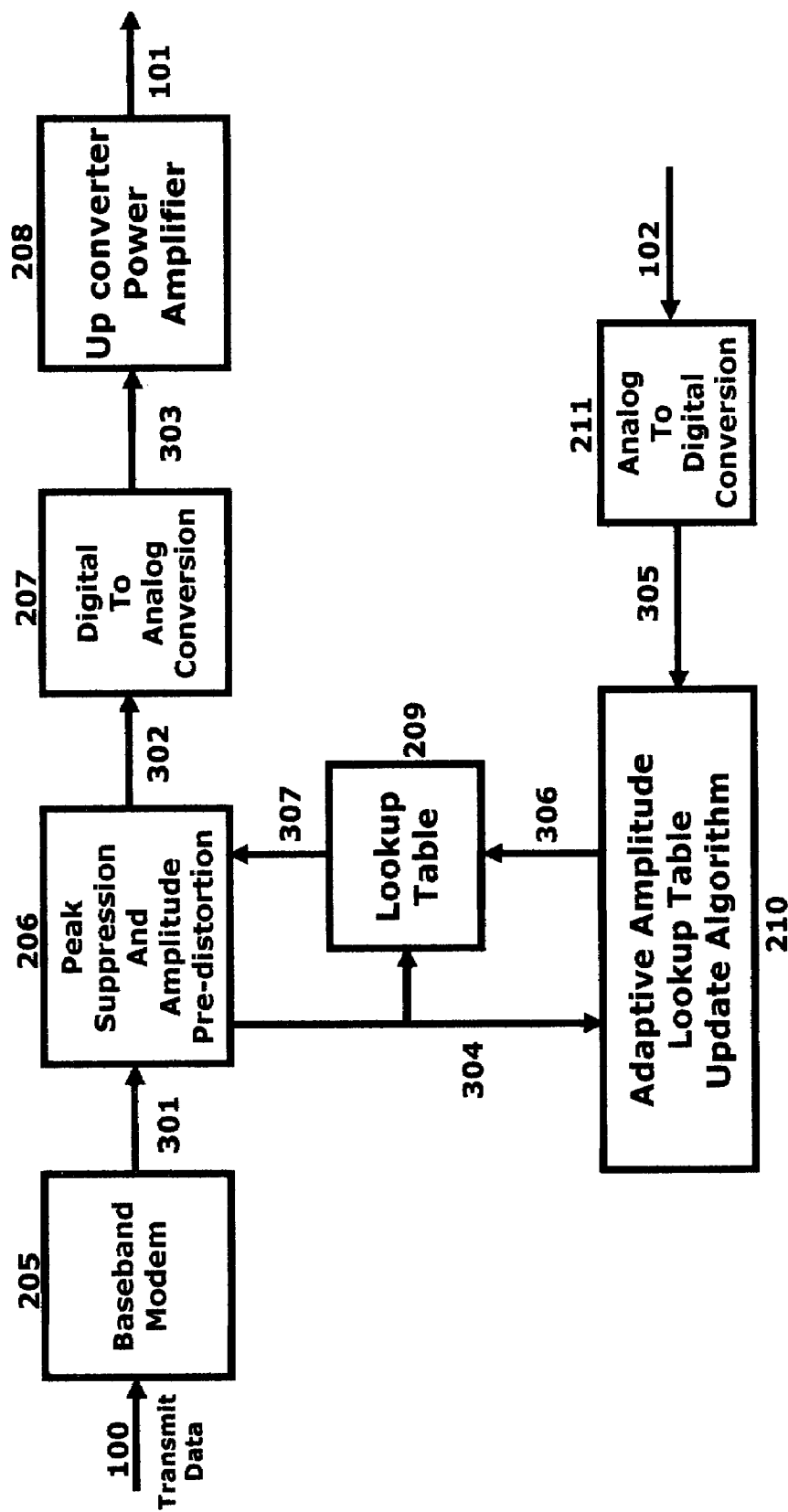
FIG. 2 is the detail block diagram of the peak-to-average reduction and pre-distortion function

FIG. 2 illustrates the detail block diagram of the transmitter incorporating the peak-to-average reduction and pre-distortion function. The transmit baseband signal 100 is applied to baseband modem 205. The output of the modem 301 is applied to peak-to-average and pre-distortion block 206. The peak-to-average reduced and pre-distorted signal 302 is then applied to the digital to analog converter block 207 to produce the analog signal 303 which is the input to up converter and amplifier block 208. The feedback envelop signal 102 is applied to analog to digital converter block 211 to produce the digitized feedback envelop signal 305. The digitized feedback envelop signal 305 is then applied to amplitude pre-distortion algorithm 210. The second input to the amplitude pre-distortion algorithm block 210 is the peak-to-average reduced baseband signal 304. The amplitude pre-distortion algorithm will use these two signals and updates the amplitude pre-distortion lookup table 209 by update information 306. The information in the lookup table 307 is used by the block 206 to amplitude pre-distort the already peak-to-average reduced baseband signal.

What is claimed is:

1. A peak-to-average reduction and pre-distortion method for use with terminal radio in a wireless communication system to enhance the output power and performance of an amplifier, in wireless cellular, Personal Communication System (PCS), Wireless Area Network (LAN), line of sight microwave, military, and satellite communication systems and wired applications, the peak-to-average reduction and pre-distortion method comprising:

find the peak-to-average ratio of transmit baseband in order to determine the amount of peak-to-average reduction;

peak-to-average reduce the transmit baseband signal;

amplitude pre-distort the peak-to-average reduced signal using data from a lookup table;

use a feedback envelop signal from the output of the amplifier and the peak-to-average reduced baseband signal to adaptively update an amplitude pre-distortion lookup table;

adaptively perform the lookup table adaptation at power up, power down, idle time, or active mode;

analog switching the output of the transmitter to a dummy load during the amplitude lookup table adaptation at power up, idle mode, and power down; and using a control signal to control switching mode of an analog switch used at the output of the transmitter.

2. The peak-to-average reduction and pre-distortion method according to claim 1, wherein the output of the amplifier is sampled to be used by an envelop detector to produce an envelop signal for the pre-distortion.

3. The peak-to-average reduction and pre-distortion method according to claim 1, wherein the amplifier's output envelop is digitized to be used by the amplitude pre-distortion.

4. The peak-to-average reduction and pre-distortion method according to claim 1, wherein the amplitude pre-distortion uses the digitized envelop signal and the peak-to-average reduced signal to adapt the pre-distortion lookup table.

5. The peak-to-average reduction and pre-distortion method according to claim 1, wherein the pre-distortion function is performed only at power up, power down, or idle time of the radio terminal.

6. The peak-to-average reduction and pre-distortion method according to claim 1, wherein the analog switching sends the amplifier output to a dummy load during the pre-distortion algorithm active time.

7. The peak-to-average reduction and pre-distortion method according to claim 1, wherein the pre-distortion could perform the adaptation during the time that the radio is in active mode.

8. The peak-to-average reduction and pre-distortion method according to claim 1, wherein the pre-distortion lookup table adaptation operates on regular time bases as needed, controlled by a timer.

9. The peak-to-average reduction and pre-distortion method according to claim 1, wherein the control signal for the analog switch is provided by the transmitter.

10. The peak-to-average reduction and pre-distortion method according to claim 1, when it is used in wireless cellular, wireless PCS, wireless LAN, microwave, wireless satellite, wired amplifiers and wireless communication systems used for military applications.

11. The peak-to-average reduction and pre-distortion method according to claim 1, wherein all the peak-to-average reduction, amplitude pre-distortion and lookup table adaptation functions can be implemented in programmable logic, FPGA, Gate Array, ASIC, and DSP processor.

* * * * *